(12) United States Patent
Bains et al.

(10) Patent No.: US 9,871,519 B2
(45) Date of Patent: Jan. 16, 2018

(54) ON-DIE TERMINATION CONTROL WITHOUT A DEDICATED PIN IN A MULTI-RANK SYSTEM

(71) Applicant: Intel Corporation, Santa Clara, CA (US)

(72) Inventors: Kuljit S. Bains, Olympia, WA (US); Nadav Bonen, Ofer (IL); Christopher E. Cox, Placerville, CA (US); Alexey Kostinsky, Ha (IL)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/359,573

(22) Filed: Nov. 22, 2016

(65) Prior Publication Data

US 2017/0077928 A1 Mar. 16, 2017

Related U.S. Application Data

(63) Continuation of application No. 14/498,794, filed on Sep. 26, 2014.

(60) Provisional application No. 62/028,295, filed on Jul. 23, 2014.

(51) Int. Cl.
*H03K 19/00* (2006.01)
*H03K 19/0175* (2006.01)
*H03K 19/018* (2006.01)
*H03K 19/0185* (2006.01)
(Continued)

(52) U.S. Cl.
CPC ......... *H03K 19/0005* (2013.01); *G06F 3/061* (2013.01); *G06F 3/0625* (2013.01); *G06F 3/0659* (2013.01); *G06F 3/0683* (2013.01); *G06F 13/4086* (2013.01); *H03K 19/0008* (2013.01); *H03K 19/01825* (2013.01); *H03K 19/017545* (2013.01); *H03K 19/018557* (2013.01)

(58) Field of Classification Search
CPC ....... G11C 7/10; G11C 11/4076; G11C 16/06; G11C 5/04; G11C 7/1072; H03K 19/0005; H03K 19/017545; H04L 25/0278; H04L 25/0298; H04L 25/028; G06F 13/4086
See application file for complete search history.

(56) References Cited

U.S. PATENT DOCUMENTS

| 8,169,233 | B2 | 5/2012 | Ferolito et al. | |
|---|---|---|---|---|
| 8,274,308 | B2* | 9/2012 | McCall | G11C 7/1045 326/30 |
| 8,588,012 | B2 | 11/2013 | Wilson et al. | |

(Continued)

OTHER PUBLICATIONS

International Search Report and Written Opinion for PCT Patent Application No. PCT/US2015/038003, dated Sep. 16, 2015, 14 pages.

*Primary Examiner* — Vibol Tan
(74) *Attorney, Agent, or Firm* — Compass IP Law PC

(57) ABSTRACT

A memory subsystem includes a multi-device package including multiple memory devices organized as multiple ranks of memory. A control unit for the memory subsystem sends a memory access command concurrently to some or all of the ranks of memory, and triggers some of all of the memory ranks that receive the memory access command to change on-die termination (ODT) settings. One of the ranks is selected to execute the memory access command, and executes the command while all ranks triggered to change the ODT setting have the changed ODT setting.

27 Claims, 10 Drawing Sheets

(51) Int. Cl.
*G06F 13/40* (2006.01)
*G06F 3/06* (2006.01)

(56) References Cited

U.S. PATENT DOCUMENTS

| | | |
|---|---|---|
| 8,619,492 B2 | 12/2013 | Jeon |
| 8,710,862 B2 | 4/2014 | Ferolito et al. |
| 9,009,540 B2 | 4/2015 | Mozak et al. |
| 9,171,585 B2 | 10/2015 | Rajan et al. |
| 9,281,816 B2 | 3/2016 | Amirkhany et al. |
| 9,385,719 B2 | 7/2016 | Shaeffer |
| 2005/0268059 A1 | 12/2005 | LaBerge |
| 2006/0106951 A1 | 5/2006 | Bains |
| 2011/0314200 A1 | 12/2011 | Wilson et al. |
| 2012/0206165 A1 | 8/2012 | Ferolito et al. |
| 2013/0031326 A1 | 1/2013 | Grunzke |
| 2013/0036273 A1 | 2/2013 | Shaeffer |
| 2013/0088258 A1 | 4/2013 | Yokou et al. |
| 2013/0307584 A1 | 11/2013 | Oh et al. |
| 2014/0002131 A1 | 1/2014 | Shaeffer |
| 2014/0244922 A1 | 8/2014 | Bains et al. |
| 2015/0244370 A1 | 8/2015 | Shaeffer |
| 2015/0331817 A1 | 11/2015 | Han et al. |
| 2016/0035703 A1 | 2/2016 | Sun et al. |
| 2016/0162214 A1 | 6/2016 | McCall et al. |

* cited by examiner

COMMAND TABLE 400

| COMMAND | SDR CMD PINS | | SDR CA PINS | | | | | | | CK EDGE |
|---|---|---|---|---|---|---|---|---|---|---|
| | CKE | | | | | | | | | |
| | CK_t (n-1) | CK_t (n) | CS | CA0 | CA1 | CA2 | CA3 | CA4 | CA5 | |
| MRW-1 | H | H | H | L | H | H | L | L | OP7 | 1↑ |
| | | | L | MA0 | MA1 | MA2 | MA3 | MA4 | MA5 | 2↑ |
| MRW-2 | H | H | H | L | H | H | L | H | OP6 | 1↑ |
| | | | L | OP0 | OP1 | OP2 | OP3 | OP4 | OP5 | 2↑ |
| MRR-1 | H | H | H | L | H | H | H | L | V | 1↑ |
| | | | L | MA0 | MA1 | MA2 | MA3 | MA4 | MA5 | 2↑ |
| REFRESH (ALL/ PER BANK) | H | H | H | L | L | L | H | L | AB | 1↑ |
| | | | L | BA0 | BA1 | BA2 | V | | | 2↑ |
| ENTER SELF REFRESH | H | H | H | L | L | L | H | H | V | 1↑ |
| | | | L | V | | | | | | 2↑ |
| ACTIVATE-1 | H | H | H | H | L | R12 | R13 | R14 | R15 | 1↑ |
| | | | L | BA0 | BA1 | BA2 | V | R10 | R11 | 2↑ |
| ACTIVATE-2 | H | H | H | H | H | R6 | R7 | R8 | R9 | 1↑ |
| | | | L | R0 | R1 | R2 | R3 | R4 | R5 | 2↑ |
| WRITE-1 | H | H | H | L | L | H | L | L | BL | 1↑ |
| | | | L | BA0 | BA1 | BA2 | V | C9 | AP | 2↑ |
| EXIT SELF REFRESH | H | H | H | L | L | H | L | H | V | 1↑ |
| | | | L | V | | | | | | 2↑ |
| MASK WRITE-1 | H | H | H | L | L | H | H | L | BL | 1↑ |
| | | | L | BA0 | BA1 | BA2 | V | C9 | AP | 2↑ |
| RFU | H | H | H | L | L | H | H | H | V | 1↑ |
| | | | L | V | | | | | | 2↑ |
| READ-1 | H | H | H | L | H | L | L | L | BL | 1↑ |
| | | | L | BA0 | BA1 | BA2 | V | C9 | AP | 2↑ |
| CAS-2 | H | H | H | L | H | L | L | H | C8 | 1↑ |
| | | | L | C2 | C3 | C4 | C5 | C6 | C7 | 2↑ |
| PRECHARGE (ALL/PER BANK) | H | H | H | L | L | L | L | H | AB | 1↑ |
| | | | L | BA0 | BA1 | BA2 | V | | | 2↑ |

FIG. 4A

MODE REGISTER 410

| ODT VALUE CONTROL FOR DQ ODT | | | |
|---|---|---|---|
| OP2 | OP1 | OP0 | VALUE |
| 0 | 0 | 0 | DISABLE |
| 0 | 0 | 1 | RZQ |
| 0 | 1 | 0 | RZQ/2 |
| 0 | 1 | 1 | RZQ/3 |
| 1 | 0 | 0 | RZQ/4 |
| 1 | 0 | 1 | RZQ/5 |
| 1 | 1 | 0 | RZQ/6 |
| 1 | 1 | 1 | RFU |

ON-DIE TERMINATION CONTROL WITHOUT A DEDICATED PIN IN A MULTI-RANK SYSTEM

CLAIM OF PRIORITY

The present application is a Continuation of U.S. application Ser. No. 14/498,794, filed Sep. 26, 2014, and claims the benefit of priority of that application. U.S. application Ser. No. 14/498,794 in turn is based on, and claims the benefit of priority of, U.S. Provisional Application No. 62/028,295, filed Jul. 23, 2014, which is incorporated herein by reference.

FIELD

Embodiments of the invention are generally related to memory devices, and more particularly to dynamically, selectively controlling on-die termination for memory access operations in a system with a multi-rank memory architecture.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2014, Intel Corporation, All Rights Reserved.

BACKGROUND

Memory devices are ubiquitous in computing devices to store data and code for a processor to execute operations and accomplish the function of the computing devices. Even as the demand for computing devices grows, there is a trend towards smaller computing devices that operate on less power, especially in mobile devices. Mobile computing devices have increased in computational performance, they have included more and more storage and memory to meet the needs of the programming and computing performed on the devices. In mobile computing devices, controlling power consumption is a key design focus. Memory devices and memory subsystems consume a significant amount of total power consumption in low power and other mobile devices.

Current memory subsystems can control memory system power consumption by eliminating on-die termination (ODT) during Write operations. While the signal quality might be degraded due to a lack of ODT, such a tradeoff can be tolerated if the distance between memory devices is small enough that the signal reflections do not significantly impact the desired signal. Such assumptions do not always hold in current systems. While some packaging solutions exist to increase the memory density in mobile device while maintaining distances between devices small, such solutions tend to be more costly and non-standard. More standard packaging solutions are less costly, but increase the distances between memory devices on the memory bus as densities increase. Thus, the distances between memory devices can cause signal degradation due to signal reflections without ODT in standard packaging solutions. Current ODT solutions use ODT pins, which use increases manufacturing cost and consumes more real estate as it increases pin count. Some ODT solutions exist that do not use separate ODT pins, but such solutions are limited to providing termination in one rank, such as by hard-coding the termination scheme. Single-rank ODT is not a sufficient solution for multi-rank memory systems.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 4A is a representation of an embodiment of a command table for controlling on-die termination for memory access.

FIG. 4B is a representation of an embodiment of a mode table for controlling on-die termination for memory access.

Figure 1:
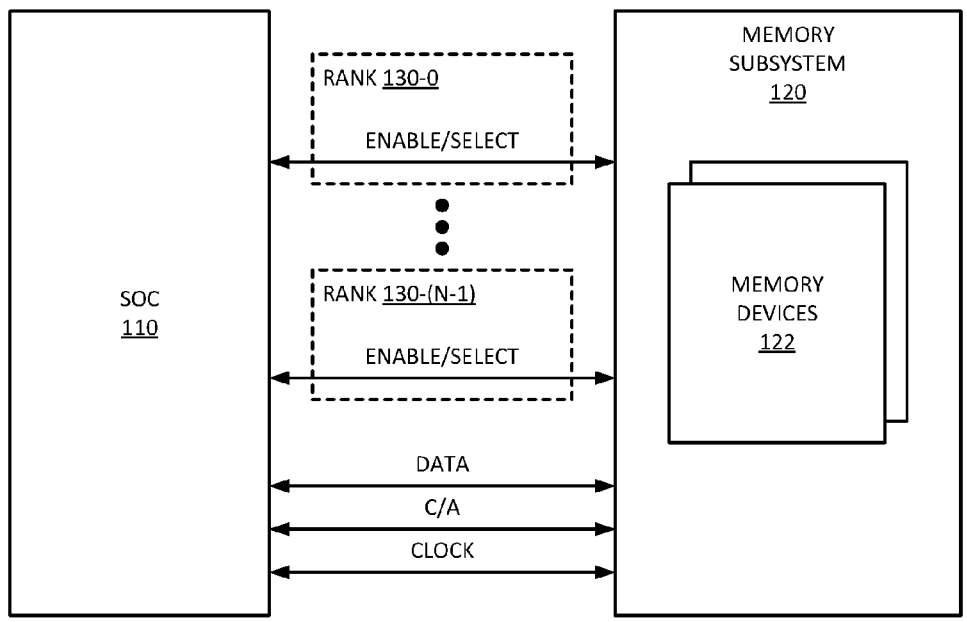
FIG. 1 is a block diagram of an embodiment of a system that applies selective control of on-die termination.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory subsystem includes a plurality of memory devices organized as multiple ranks of memory. A rank of memory refers to a number of memory devices or chips that all receive and respond to a common command from an associated memory controller or comparable control unit. A rank of memory includes one or more memory devices connected in parallel. The memory devices in the rank typically share a data bus, C/A (command/address) bus, and a generally share clock signals. The separate devices in a rank can receive dedicated clock enable (CKE), chip select (CS), and on die termination (ODT) signals. The memory controller refers to a circuit and/or device that controls access to the memory devices. The memory subsystems described herein include memory devices in multi-device packages. The multi-device packages typically include memory devices of different ranks in the same package.

The memory controller sends a memory access command concurrently to some or all of the ranks of memory. The memory controller can selectively trigger the memory ranks to change an on-die termination (ODT) setting, such as engaging ODT for a Write operation, disengaging ODT for a Read operation, and/or changing a value of ODT for a Read or Write operation. Thus, the memory controller can send a memory access command to all ranks and trigger some or all of those ranks to change the ODT setting, or send a memory access command to a subset of ranks and trigger some or all of them to change the ODT setting. It will be understood that ODT refers to connecting a resistor between a power supply rail and the signal line at the receiver side. In one embodiment, the power supply rail is VDD or the high voltage supply. In one embodiment, a memory device can terminate from the signal line to Vss or ground or the low voltage supply. In any scenario, one of the ranks is selected to execute the memory access command, which rank can be referred to as the target of the memory access command. The target rank executes the command while the other triggered ranks maintain the changed ODT setting for the memory access operation.

Traditional memory subsystems can control memory system power consumption by eliminating the use of ODT during a Write. It will be understood that entirely eliminating ODT is distinguished from selectively applying ODT as described herein. While the signal quality might be degraded due to a lack of ODT in the traditional Write case, such a tradeoff can be tolerated if the distance between memory devices is small enough that the signal reflections do not significantly impact the desired signal. Such assumptions are not always valid in current systems where multi-device packaging is used. While some traditional packaging solutions exist to increase the memory density in mobile device while maintaining sufficiently small distances between the devices to preserve the assumptions, as memory densities increase such solutions tend to be more costly and non-standard. More standard and less costly packaging solutions also exist, but increase the distances between memory devices on the memory bus as densities increase, which does not preserve the assumptions. Thus, the distances between memory devices in standard packaging solutions can cause signal degradation due to signal reflections without ODT. However, by selectively applying ODT on Write (or similarly selectively de-applying ODT on Read), such standard packaging solutions can be used even with increased memory densities.

In accordance with what is described herein, there can be several use cases for ODT. In a first use case, the memory device is unterminated and thus ODT is always off. A memory device can be considered unterminated when it is set (e.g., by a configuration register) to have ODT disabled in the system. It will be understood that there is a difference between a memory device that does not have ODT enabled by configuration, and one that has the ability to selectively switch ODT off for different memory access operations. For certain transactions the memory device can selectively disable ODT, but for other transactions the memory device can enable ODT. In the unterminated case the memory device does not switch between enabling and disabling ODT, because it is off by configuration. In a second use case, the memory device engages ODT only during write for the target rank only. Thus, a memory device is configured to engage ODT when decoding the write command indicates it is the target rank. In a third use case, multiple ranks of memory can apply ODT during a write transaction. In a fourth use case, multiple ranks of memory can apply ODT during a read transaction. As mentioned above, the third and fourth use cases have traditionally been accomplished by use of a dedicated ODT pin. As discussed herein, the system can trigger ODT on multiple ranks for either a read transaction or a write transaction without use of a dedicated ODT pin.

Reference to memory devices can apply to different memory types. Memory devices generally refer to volatile memory technologies. Volatile memory is memory whose state (and therefore the data stored on it) is indeterminate if power is interrupted to the device. Dynamic volatile memory requires refreshing the data stored in the device to maintain state. One example of dynamic volatile memory includes DRAM (dynamic random access memory), or some variant such as synchronous DRAM (SDRAM). The memory subsystem described herein may be compatible with a number of memory technologies, such as LPDDR4 (LOW POWER DOUBLE DATA RATE (LPDDR) version 4, JESD209-4, originally published by JEDEC (Joint Electronic Device Engineering Council) in August 2014), and/or others, and technologies based on derivatives or extensions of such specifications. The memory includes multiple ranks of memory. In one embodiment, the memory subsystem issues multiple commands to perform a single memory access operation. In one embodiment, each command is a multi-cycle command.

LPDDR4 is one example of memory technology designed for modern computing systems. While some memory technologies implement wider I/O (input/output) interfaces, some technologies such as LPDDR4 are designed to have a narrower interface but still allow increased memory densities. Thus, multi-device packaging is typically used in technologies that seek to increase density while keeping a narrow I/O interface. While reference is made specifically to memory device, and certain examples to LPDDR4 memory, it will be understood that inter-chip communication of all types is significant in modern computing systems. Thus, the descriptions herein can apply equally well to memory technologies not specifically identified, and can also apply to inter-device communication for devices of any type that share a common bus to devices in multi-device packaging.

FIG. 1 is a block diagram of an embodiment of a system that applies selective control of on-die termination. System 100 illustrates portions of a memory subsystem of a computing device. System 100 includes volatile memory subsystem 120 and SOC (system on a chip) 110. SOC 110 represents a host controller for system 100. SOC 110 can include one or more processors, which can include single and/or multicore processors. SOC 110 also includes one or more memory controllers to control memory devices 122 of memory subsystem 120. In one embodiment, rather than a system on a chip implementation, system 100 can include discrete processor and memory controller components. In one embodiment, the memory controller can be implemented as a separate physical device from a package that includes processor(s) and cache components. In one embodiment, the memory controller is part of a processor, such as a circuit of a processor. In one embodiment, the memory controller is implemented in logic on SOC shared by multiple processor devices.

SOC 110 and/or a memory controller of system 100 includes hardware connectors to couple to memory subsystem 120 and its memory devices 122. Memory subsystem 120 includes multiple memory devices 122, which each includes memory arrays to store data. The hardware (connectors, pins, balls, signal lines, or other hardware components) can be considered an I/O interface between the interconnected components (e.g., SOC 110 and/or a memory controller, and memory subsystem 120). Memory devices can be organized as ranks to facilitate access to larger numbers of bits concurrently. A rank includes multiple memory devices in parallel. In one embodiment, ranks 130 share data pins, command/address (C/A) pins, and clock pins. Each rank 130 also has a specific one or more enable signals to select between different ranks. As illustrated, system 100 includes N ranks 130. The specific grouping of the signal lines is not necessarily physically grouped by rank. In one embodiment, certain signal lines are reused between ranks 130. Regardless of the specific physical implementation of the signal lines that make up the I/O interface, the ranks of memory devices 122 share a common set of signal lines or an access bus. In one embodiment, all memory devices 122 share the same data bus, command/address (C/A) bus, and share a clock or strobe signal (which can include one or more signal lines). System 100 can use enable signals, such as CKE (clock enable) and chip select (CS), and/or CS and other enable signals, to distinguish one rank or device grouping from another. Thus, memory devices 122 that are part of the same rank 130 can share the same enable/select signal. In an implementation involving an I/O interface between something other than a memory subsystem, rank 130 can represent some other grouping of devices by common bus.

System 100 can selectively apply ODT to preserve signal quality on a selected or target rank (one of ranks 130). In one embodiment, each device in a rank 130 shares ODT signaling. The ODT termination is significant for Write operations when the distance between the memory devices in the ranks increases, and based on signaling frequency, which dictates signal integrity. For example, similar to what is discussed above, memory subsystem 120 can include packaging where proximity and signal quality assumptions do not hold true, and ODT could be necessary to preserve signal quality for a Write. Emerging octo-die package (ODP) technology can operate without ODT on Write because it includes eight die or devices stacked on top of each other in close proximity, which preserves the signal quality assumption. In certain implementation of an ODP or stacked packaging can implement target rank ODT, which also does not require signaling from the memory controller (the second use case described above). However, to have the same density of devices with a more standard quad-die package (QDP), which would require two QDP packages, signal quality can suffer without applying ODT on multiple ranks.

SOC 110 and/or a memory controller (generically referred to as "logic") implements selective ODT by rank to preserve signal quality, while not requiring continuous use of ODT. The logic can selectively apply ODT on multiple ranks for a memory access transaction. In one embodiment, the logic sends a memory access command concurrently to multiple ranks 130. Thus, at least two ranks 130 receive the command, even though only one of the ranks is the target rank to implement the command. In one embodiment, the logic triggers a selected number of the multiple ranks receiving the command to change an ODT setting. Traditionally, the application of ODT is controlled via signaling, rather through the memory access commands. In one embodiment, the logic can trigger ODT via a memory access command. In one embodiment, on Write the logic triggers the memory devices of the target rank to engage ODT, as well as at least one other rank to suppress reflections; thus, changing the ODT setting can include selectively engaging ODT on selected memory ranks. In one embodiment, on Read the logic triggers the memory devices of one or more non-target ranks to engage ODT. On Read the target rank typically does not engage ODT. Generally, the system will trigger ODT changes in pairs on Write. In one embodiment, the system selects at least one rank per package to engage ODT for Writes, which can include the target rank. In one embodiment, the system selects at least one non-target to engage ODT for Reads. In one embodiment, the system applies the change across all ranks for the memory access transaction. The target rank executes the command while the selected ranks maintain the changed ODT setting. Thus, the ODT can be applied across packages and suppress reflections sufficiently to preserve signal quality for the memory access transaction on Write, and reduce the load on Read and suppress reflections on Read. Thus, the memory access command can be either a Read command or a Write command.

In one embodiment, all ranks that receive the memory access command change the ODT setting. The number of ranks that receive the memory access command can be a subset or all of the ranks in system 100. In one embodiment, sending the command to the rank will trigger the rank to change the ODT setting for the memory transaction. The memory devices can be configured to change the ODT setting for a period of time equal to an expected duration of a memory access transaction. A memory transaction refers to a full number of cycles used to exchange data for a Read or Write memory access operation. For example, a Read transaction will last long enough for each memory device to access and provide one or more bits of information over one or more execution cycles (clock cycles) to the memory controller. Similarly, a Write transaction lasts long enough for the memory controller to transfer all data bits into the receive buffers of the selected target memory devices. A transaction can be a burst length (a number of cycles used to transfer data associated with a memory access command over the data bus).

Figure 2:
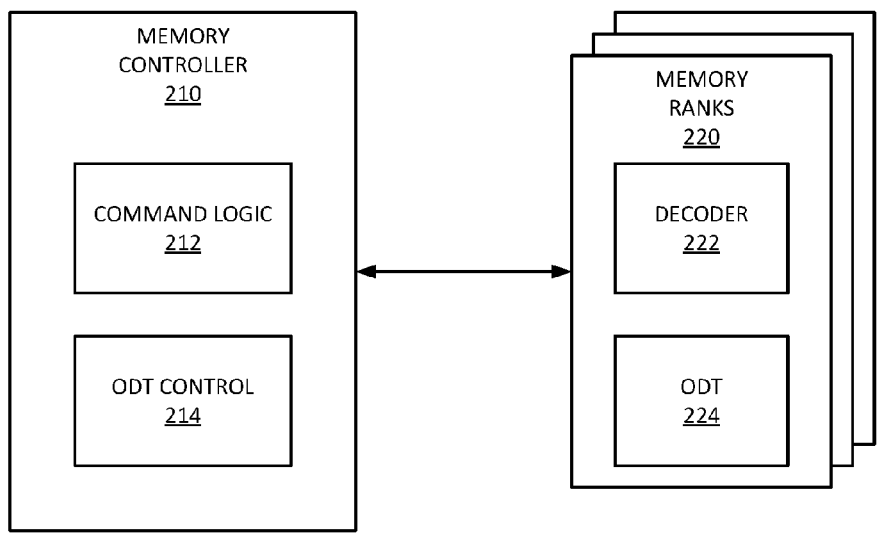
FIG. 2 is a block diagram of an embodiment of a system having processor system logic that applies on-die termination control for memory devices in a memory system.

FIG. 2 is a block diagram of an embodiment of a system having processor system logic that applies on-die termination control for memory devices in a memory system. In one embodiment, system 200 can include elements of an implementation of system 100. In one embodiment, system 200 includes memory controller 210, which represents a logic control unit or logic circuit that controls an I/O interface to memory ranks 220. Memory ranks 220 represent multiple ranks of memory that store code and/or data for a host system to execute operations. Memory ranks 220 can be spread in multiple multichip packages (MCP) or other packaging that includes multiple devices. While the devices within the packages may be spaced close enough that the risk of signal degradation due to reflections is tolerable, because there are multiple device packages, there is a high likelihood of signal degradation due to the spacing of ranks between packages.

In one embodiment, memory controller 210 can be part of an SOC. In one embodiment, memory controller 210 can be a standalone component. Memory controller 210 can include command logic 212 to determine and control what memory access commands (e.g., Read or Write) to send to what memory devices, and when. In one embodiment, memory controller 210 includes ODT control logic 214 to determine what memory ranks 220 to selectively enable and/or disable ODT during given memory access commands. In one embodiment, memory controller 210 implements ODT setting changes selectively on Read and Write transactions across all ranks 220. In one embodiment, memory controller 210 identifies system configuration for the memory subsystem, such as by querying the components for their type and/or accessing information stored in a BIOS (basic input/output system) or other system control that provides configuration information. Based on the configuration (e.g., how many devices per package, how the ranks are assigned per package) and the selected target rank (e.g., determining which package(s) the target rank is located in), ODT control 214 can determine to selectively change ODT settings for one or more memory ranks 220 in addition to the target rank.

While not specifically shown, each memory rank 220 includes multiple memory devices. The memory devices of memory ranks 220 each include decoder 222 to process incoming commands. Via decoder 222, every memory device of every rank 220 can determine if it is part of the target rank, and what ODT setting to apply for a given memory access transaction. Each memory device includes ODT 224, which represents both the hardware to implement ODT as well as the logic to determine how to apply ODT based on commands and/or signaling received from memory controller 210. In one embodiment, memory controller 210 can essentially piggyback ODT information onto commands without having to use separate pins to enable and disable ODT. The memory devices themselves can be configured to selectively enable and disable ODT based on commands received from the memory controller. In one embodiment, the memory devices default to leaving ODT disengaged, and only engage ODT based on the memory subsystem configuration and the memory access commands sent by the memory controller. In one embodiment, the memory devices can default to engaging ODT, and can selectively disengage ODT based on the memory subsystem configuration and the memory access commands.

For example, each memory device can decode an incoming memory access command received from memory controller 210 and determine whether to apply ODT 224 based on information encoded in the command, and/or based on settings of combinations of sequential commands. Certain examples are provided below with respect to FIG. 4A. Briefly, in one embodiment, memory controller 210 can trigger certain memory ranks 220 to apply setting changes to ODT 224 based on sending the memory access commands to the ranks with certain enable signals set true or false in specific combinations. The memory devices can be configured to decode such combinations for purposes of selectively engaging ODT 224.

In one embodiment, ODT 224 includes multiple different levels of impedance that each memory rank 220 can set. Not all memory ranks will necessarily set ODT to the same level of resistance, even during a memory transaction where multiple ranks are applying ODT. Thus, each rank can be triggered to turn on or engage ODT for a memory transaction, and in one embodiment, each memory rank applying ODT can engage ODT of different resistance levels. In one embodiment, all ranks applying ODT apply the same level of resistance. In one embodiment, the value of resistance to apply is set by Mode Register, or by command, or by other communication or signaling the memory controller 210.

Figure 3A:
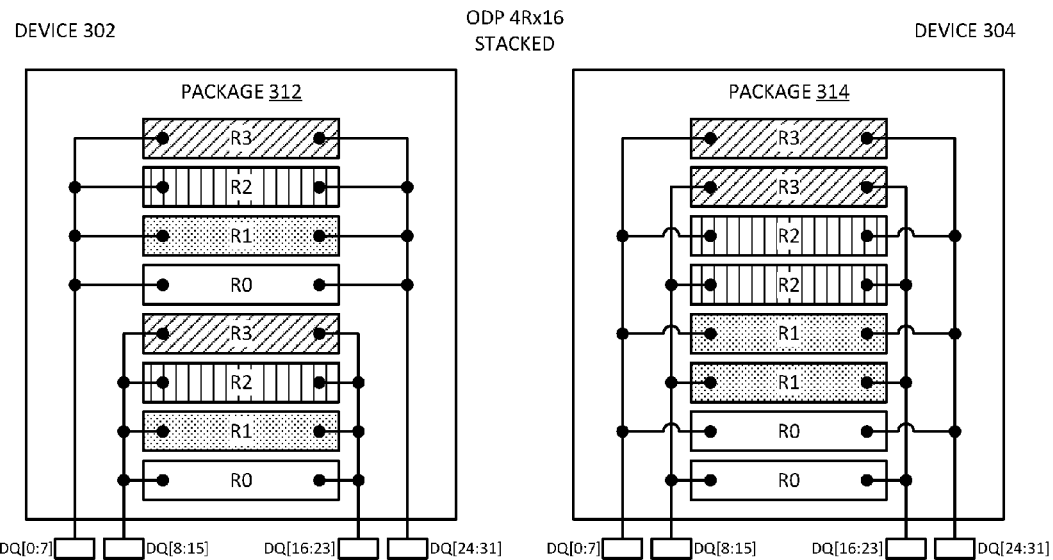
FIG. 3A is a block diagram of embodiments of known octo-die packaging.

FIG. 3A is a block diagram of embodiments of known octo-die packaging. Devices 302 and 304 both represent know examples of four rank systems using x16 devices. It will be understood that x16 refers to a device that with a 16-bit wide data I/O bus. Thus a x8 device has an 8-bit wide data I/O bus, a x32 device has a 32-bit wide data I/O bus, and so forth. Package 312 that is part of device 302, and package 314 that is part of device 304 include memory devices in an octo-die package (ODP). Devices 302 and 304 can be memory modules and/or components that are processed onto a host system substrate or board.

As illustrated, package 312 includes eight die or memory devices stacked on each other, and is organized as four ranks (R0 . . . R3). Device 302 organizes the memory devices from the device closest to the signal lines to the device farthest from the signal lines as: R0, R1, R2, R3, R0, R1, R2, and R3. As the devices are x16, they should each be connected to 16 DQ signal lines. Device 302 is configured with the lower four devices connecting to DQ[8:23], and the upper four devices connecting to DQ[0:7] and DQ[24:31]. Device 304 organizes the memory devices from the device closest to the signal lines to the device farthest from the signal lines as: R0, R0, R1, R1, R2, R2, R3, and R3. Device 304 is configured with the zeroeth, second, fourth, and sixth devices connecting to DQ[8:23], and the first, third, fifth, and seventh devices connecting to DQ[0:7] and DQ[24:31].

The ODP illustrates a known approach to packaging that preserves the assumptions of proximity that allows not applying ODT on multiple ranks. Because the devices share a package, the distances of the signal lines to each memory device eliminate the need for termination by any device other than the target or selected device for Write. Thus, only the target device or target rank needs to provide termination on Write. It will be understood that package 312 will be part of device 302, which will include multiple packages similar to package 312. The same is true of package 314 of device 304. Thus, the ranks as illustrated will include similarly positioned device in other packages of the device. While packages 312 and 314 can eliminate the need for termination, current processing techniques result in very low yields for eight-high stacks such as those shown. The low yields increases the cost and reduces the adoption of the packaging.

Figure 3B:
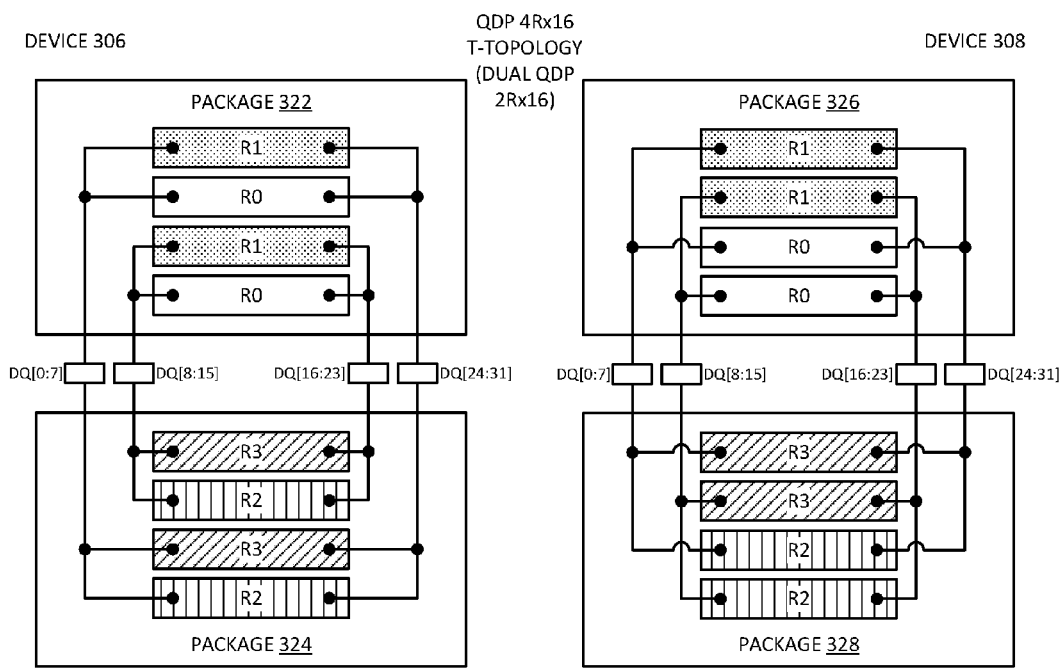
FIG. 3B is a block diagram of embodiments of memory devices mounted in quad-die packages where the system provides selective on-die termination control.

FIG. 3B is a block diagram of embodiments of memory devices mounted in quad-die packages where the system provides selective on-die termination control. Similar to what is illustrated in FIG. 3A, instead of having a single die with a 64 bit wide interface (or greater), or even a 32 bit wide interface, a memory subsystem can be made from x16 devices as illustrated, or x8 devices. In one embodiment, a memory architecture uses two separate packages of four devices or dies each to provide a four-rank x16 memory. Device 306 and device 308 represent devices that incorporate such memory architecture. Devices 306 and 308 can be memory modules, or can be host system boards themselves. Devices 306 and 308 illustrate a 'T' topology on the data bus, where signal lines connectors branch out into two separate packages from the signal line connectors. The memory controller associated with the ranks of memory can selectively enable ODT to selectively provide termination on both branches of the 'T' to minimize reflection on Write. Thus, the system can provide termination in a device other than (or in addition to) the selected or target device, on a per transaction basis. In one embodiment, the system does not have to provide termination on all devices, but can select a subset of the devices to apply ODT on Write.

In one embodiment, device 306 includes packages 322 and 324, each including four devices organized as two ranks of the four ranks total. Specifically, package 322 includes ranks R0 and R1, and package 324 includes ranks R2 and R3. Package 322 as illustrated includes memory devices organized from the device closest to the signal lines to the device farthest from the signal lines as: R0, R1, R0, and R1. Package 322 is configured with the closer R0 and R1 devices connecting to DQ[8:23], and the farther R0 and R1 devices connecting to DQ[0:7] and DQ[24:31]. Package 324 as illustrated includes memory devices organized from the device closest to the signal lines to the device farthest from the signal lines as: R3, R2, R3, and R2. Package 322 is configured with the closer R3 and R2 devices connecting to DQ[8:23], and the farther R3 and R2 devices connecting to DQ[0:7] and DQ[24:31].

In one embodiment, device 308 includes packages 326 and 328, each including four devices organized as two ranks of the four ranks total. Specifically, package 326 includes ranks R0 and R1, and package 328 includes ranks R2 and R3. Package 326 as illustrated includes memory devices organized from the device closest to the signal lines to the device farthest from the signal lines as: R0, R0, R1, and R1. Package 326 is configured with the closer R0 and R1 devices connecting to DQ[8:23], and the farther R0 and R1 devices connecting to DQ[0:7] and DQ[24:31]. Package 328 as illustrated includes memory devices organized from the device closest to the signal lines to the device farthest from the signal lines as: R3, R3, R2, and R2. Package 328 is configured with the farther R3 and R2 devices connecting to DQ[8:23], and the closer R3 and R2 devices connecting to DQ[0:7] and DQ[24:31].

It will be understood that in either the case of devices 306 or 308, other configurations of the memory devices, the rank organization, and the connections to the signal lines can be modified. Thus, the examples are illustrative, and are not limiting. Both devices 306 and 308 employ quad-die package (QDP) technology, which generally provides much better yields than ODP. While splitting the eight memory device chips into two separate packages prevents turning ODT off completely, the system can apply ODT selectively.

Consider an example of selective application of ODT in device 306. Consider a Write command to write to rank R1. In one embodiment, R1 will terminate the signal because it is the target rank, and will absorb the signal energy entering package 322. In one embodiment, the system can also trigger rank R3 and/or rank R2 to engage ODT to absorb the signal energy in package 324 to preserve signal quality by reducing reflections. The different devices triggered to apply ODT can keep ODT engaged for a period of a memory access transaction.

As one specific example, consider LPDDR4 devices, which are defined with no ODT pins as JEDEC defined topologies have limited pinouts by design. In accordance with what is described herein, in one embodiment a DRAM device being written to provides ODT termination based on decoding a Write command. In one embodiment, a memory subsystem can include a 'T' topology on the data bus. Such a configuration will be limited in frequency scaling if termination is provided on only one branch of the 'T'. However, a memory controller or comparable logic control circuit interfacing with the LPDDR4 devices can provide selective application of ODT. In one embodiment, the memory controller selectively triggers ODT on any given device based on decoding Write commands. Providing such decoding in the memory access command or another command can selectively apply ODT without needing to use additional pins. Thus, the system can selectively apply ODT on one or more non-target ranks for Write and/or Read.

FIG. 4A is a representation of an embodiment of a command table for controlling on-die termination for memory access. Command table 400 can more specifically be an example of an embodiment of commands for use in an LPDDR4 system. A memory controller generates the commands listed to generate the desired operation. LPDDR4 uses multi-cycle commands. For example, a Write command consists of two cycles of WRITE-1 followed by two cycles of CAS-2 (refer to table 400). The SoC or memory controller or equivalent (generically "memory controller") sends each cycle consecutively or sequentially without gaps.

In one embodiment, the memory controller broadcasts or multicasts a WRITE-1 command to multiple ranks. The memory controller can assert a Chip Select (CS) signal or other enable signal when sending the Write command to ensure that the desired ranks receive the command. The command is not necessarily sent to every rank or every DRAM device, but it can be. In one embodiment, the memory controller sends the command to at least one rank per package. In one embodiment, DRAM devices receiving a WRITE-1 command are configured to automatically turn on ODT. The DRAMs can keep ODT engaged on for the duration of the Write transaction, which includes all cycles of all commands used to implement the operation. In one embodiment, the memory controller only sends CAS-2 to the rank receiving the data. Thus, DRAMs may receive a WRITE-1 command and engage ODT, but not receive a subsequent CAS-2 command. Thus, the DRAM will not execute the command, but can still be configured to maintain ODT engaged.

A similar approach can be applied for Read transactions. For example, the memory controller can broadcast or multicast a READ-1 command to two or more ranks. The memory controller can then send a CAS-2 command addressed only to the target rank, with the other, non-target ranks not receiving the CAS-2 command. The memory controller can select the target rank and one or more other ranks to disengage ODT for the Read transaction.

Thus, the memory controller causes the target rank to execute the command or memory access operation (e.g., Read or Write), while one or more other ranks selectively apply ODT by changing an ODT setting for the duration of the memory access transaction or operation. In one embodiment, the duration of the memory access transaction can also cover the programmed preamble and postamble values for the memory access type (e.g., Read or Write).

In one embodiment, the memory subsystem defaults to all ranks applying ODT for Write. A memory subsystem may default to all ranks applying ODT, for example, when terminating to Vss. Thus, if the bus is in tristate or Vss, there will be no power consumption. Rtt_park refers to a high valued resistor connected to the termination, which can eliminate the need to activate ODT except for the target rank. The target rank can use a lower value resistance (e.g., Rtt_wr). While such an implementation would not require selectively controlling ODT at non-target ranks, the high value resistance can reduce signal integrity and increase power consumption. In one embodiment, the memory devices support different value of ODT. In one embodiment, the system can select one rank on each branch of the T and use a higher value of resistance for ODT (such as the value that would be used for Rtt_park). In one embodiment, the system can use the same Rtt_park value for Reads and Writes on the non-target rank(s). However, for Read commands to a non-target rank, setting ODT to the Rtt_park value can result in a non-optimal solution. Thus, the memory controller can send a READ-1 broadcast command to cause the memory devices to change Rtt_park to Rtt_nom on the non-target rank(s). In one embodiment, the memory controller can send a READ-1 command to selectively enable ODT as needed on the non-target rank(s).

Consider a specific example of a Write command in LPDDR4 in accordance with Table 400. In LPDDR4, the system uses two commands that each use two cycles for a write or read operation. Thus, a write operation takes four cycles by sending two cycles of WRITE-1 command followed sequentially by two cycles of CAS-2. In one embodiment, when a memory device sees a write command (WRITE-1) (or when it receives a command for which it is selected), it enables ODT. The memory controller can enable ODT on multiple ranks by triggering a CS signal (CS=H on cycle 1 of WRITE-1) on the command. In one embodiment, the device will engage or enable ODT for a burst length, and then turn off ODT.

Thus, the system can send a WRITE-1 on the shared C/A bus and send a CS to multiple ranks concurrently. The devices that receive the WRITE-1 command with the CS can activate or engage ODT. The system then sends CAS-2 to a selected or target rank. If a rank received a CS on the WRITE-1 command (CS=H on the first cycle of WRITE-1), but does not receive a CAS-2 CS signal (CS=L on the first cycle of CAS-2), then the memory device leaves ODT activated, but does not execute the command or operation. In one embodiment, only the memory device selected with a CS=H on the second cycle of the CAS-2 command executes the memory access operation. Thus, in one embodiment, ranks that are not selected for ODT receive a CS L-L for WRITE-1, and a CS L-L for CAS-2. Ranks that are selected for ODT, but that are not the target rank receive a CS H-L for WRITE-1, and a CS L-L for CAS-2. The target rank receives a CS H-L for WRITE-1, and CS H-L for CAS-2. The memory controller can selectively generate all of these signals to selectively trigger the desired ODT. In one embodiment, the memory controller activates ODT for at least one rank per package.

It will be understood that the system can similarly selectively enable ODT for Read operations. For example, the memory controller could selectively enable a CS signal for READ-1 and CAS-2 commands to trigger ODT enabling by certain ranks (e.g., one or more non-target ranks), as well as identifying the target rank to execute the Read command. In one embodiment, a memory device initially does not have ODT engaged. In one embodiment, a memory device that receives a READ-1 command will determine based on the CAS-2 command whether to engage ODT. For example, in one embodiment, the memory device expects to receive a CAS-2 command to follow immediately after a READ-1 command. Thus, if the memory device receives a READ-1 command with a select signal set to true followed by a CAS-2 command with the select signal set to false, the memory device can engage ODT. A memory device that receives the READ-1 command with the select signal set to true followed by a CAS-2 command with the select signal set to true will disengage ODT or leave ODT disengaged and execute the command. In one embodiment, with a Write operation, a rank that receives a WRITE-1 with a select signal set to true followed by a CAS-2 with the select signal set to false will engage ODT and leave it engaged while not executing the command. A rank that receives a WRITE-1 with the select signal set to true followed by a CAS-2 with the select signal set to true will engage ODT and execute the command. Thus, in one embodiment, for a Read, the lack of CAS-2 command can trigger the rank to engage ODT, while for a Write the receiving the WRITE-1 command can trigger the rank to engage ODT. The registration of a memory device (i.e., the rank the memory device belongs to receives a CS signal along with the command sent on the C/A bus) or lack of registration can be used to determine what state of ODT the memory device should apply.

FIG. 4B is a representation of an embodiment of a mode table for controlling on-die termination for memory access. Mode Register (MR) 410 represents a register or storage area local to a memory device that can be used to program a desired ODT value for Writes on a given rank. In one embodiment, a Mode Register can indicate a value of resistance for the termination for each device. MR 410 shows different values based on the settings of OP[0:2]. Based on the settings of OP[2:0], ODT can be disabled [000], have an intrinsic value [001], or be divided by some multiple (divided by 2, 3, 4, 5, or 6 for [010] to [110], respectively). In one embodiment, various different termination resistance values can be selected by setting MR 410.

In one embodiment, an Rtt_park value can be in the neighborhood of 240 Ohms, and an Rtt_nom value can be in the neighborhood of 40 Ohms (which can correspond to different values in MR 410, depending on the intrinsic value of RZQ). The Rtt_nom can be set to provide good termination to the signal based on expected impedance matching. The value of Rtt_park can be set low enough to suppress most noise (and is therefore not considered a high impedance state), but will not terminate as well as the Rtt_nom value. The benefit of setting Rtt_park higher than Rtt_nom is that the higher value will draw less current. It will be understood that different ranks can be set to different resistance values based on the command received, or whether or not a command is received.

Figure 5A:
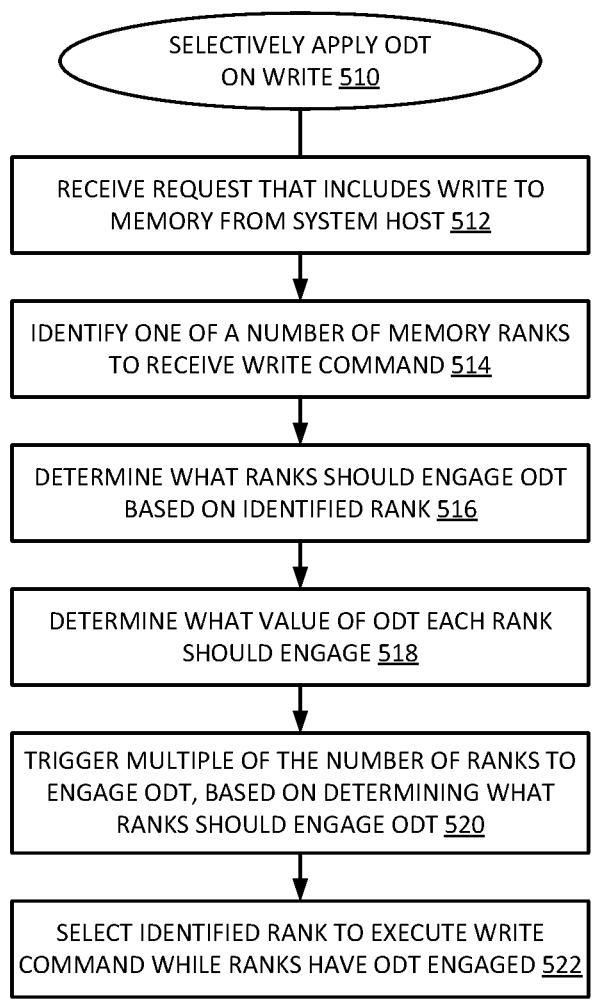
FIG. 5A is a flow diagram of an embodiment of a process for selectively applying on-die termination for a Write operation.

FIG. 5A is a flow diagram of an embodiment of a process for selectively applying on-die termination for a Write operation. A memory subsystem can include multiple memory devices or DRAMs that store data, and a memory controller that provides memory access commands to the memory devices. The memory devices are organized as ranks of memory, with multiple devices that respond together to a memory access command forming a rank. In one embodiment, the ranks are separated in multiple different multi-device packages. The operations of process 510 occur in the memory subsystem.

In one embodiment, the memory controller receives a request from a host system processor that includes the need to write to memory, 512. In one embodiment, the memory controller identifies one of the number of memory ranks in the system as a target rank for the write command, 514. The memory controller will identify the target memory rank based on how data is mapped to the memory arrays of the memory devices.

In one embodiment, the memory controller determines what ranks should engage ODT based on the rank identified as the target rank, 516. For example, the memory controller can follow a guide or rule to ensure that at least one rank per memory device package engages ODT for a write operation. In one embodiment, the memory controller further determines what value of ODT should be applied by each rank, 518. In certain implementations, a non-target memory device can provide sufficient termination by applying a value of ODT that is different than the value applied by the target rank. For example, in one embodiment, a memory device that is part of the target rank can drive Rtt_wr, and if it is not part of the target rank it can drive Rtt_nom (a nominal value of resistance).

The memory controller triggers multiple ranks to engage ODT, based on determining which ranks should engage ODT, 520. As described above, the memory controller can trigger a memory device to engage ODT by an enable or chip select signal. In one embodiment, the memory controller could issue a separate command to cause the memory device to engage ODT. The target rank will execute the write command while all ranks selected to engage ODT have ODT engaged, 522.

Figure 5B:
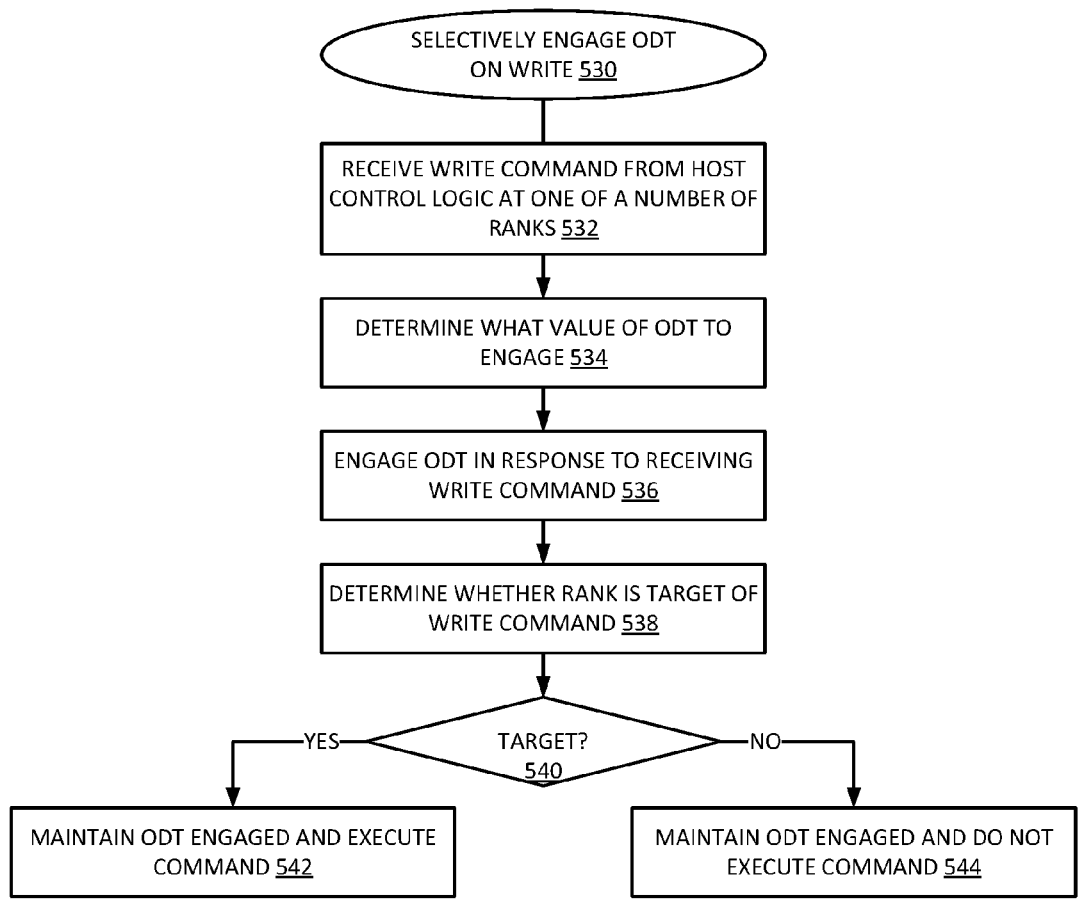
FIG. 5B is a flow diagram of an embodiment of a process for selectively engaging on-die termination for a Write operation.

FIG. 5B is a flow diagram of an embodiment of a process for selectively engaging on-die termination for a Write operation. A memory subsystem can include multiple memory devices or DRAMs that store data, and a memory controller that provides memory access commands to the memory devices. The memory devices are organized as ranks of memory, with multiple devices that respond together to a memory access command forming a rank. In one embodiment, the ranks are separated in multiple different multi-device packages. The operations of process 530 occur in the memory subsystem.

In one embodiment, a memory device that is one of multiple memory devices in one of multiple ranks in the memory subsystem receives a write command from the memory controller, 532. Many discussions above refer to a "memory rank" performing an operation. Such an expression will be understood as shorthand to refer to the fact that each memory device within the rank performs the operation to respond to the command. As discussed above, in one embodiment, a memory device receives a memory access command when the memory controller selects the device to receive the command. In one embodiment, the memory device performs a change to an ODT setting in response to receiving a command, based on decoding what type of command is received.

Thus, the memory device decodes the incoming memory access command and determines that it is a write command, and that it is selected to receive the command. In response to the decoding, the memory device can determine what value of ODT to engage, 534. In one embodiment, the memory device accesses a mode register (MR) for the memory device to determine what value of ODT is selected in the MR settings. In one embodiment, the memory device engages ODT in response to receiving the write command, in accordance with the ODT value indicated, 536. In one embodiment, a memory device that is part of the target rank can drive Rtt_wr, and if it is not part of the target rank it can drive Rtt_nom. Thus, not all ranks that apply ODT will drive the same amount of resistance.

In one embodiment, the memory device determines whether it is part of the target rank for the write command, 538. In one embodiment, the memory device makes the determination based on whether it is selected in a subsequent memory access command (e.g., in a CAS-2 command as described above). In one embodiment, the memory device can receive another command from the memory controller indicating the target rank. If the memory device is part of the target rank, 540 YES branch, the memory device maintains ODT engaged and executes the command, 542. If the memory device is not part of the target rank, 540 NO branch, the memory device maintains ODT engaged, but does not execute the command.

Figure 5C:
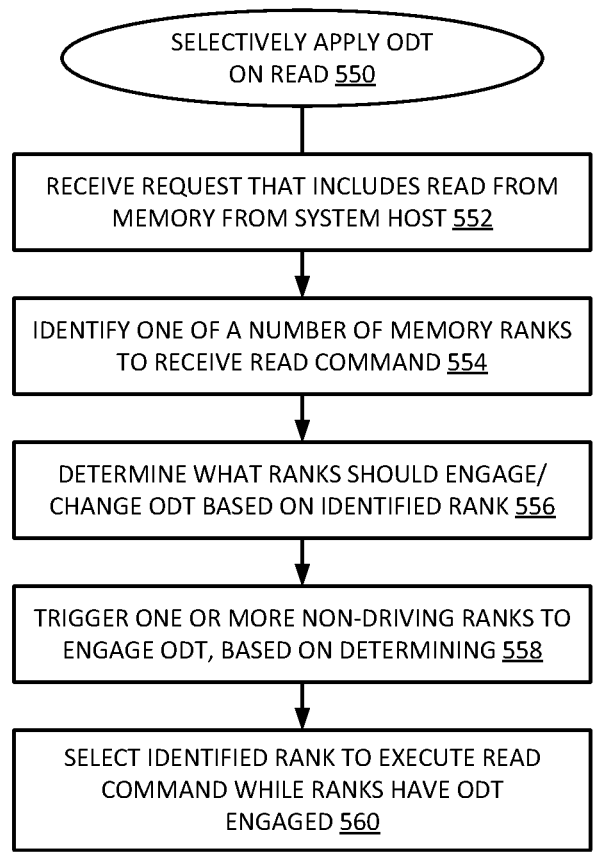
FIG. 5C is a flow diagram of an embodiment of a process for selectively applying on-die termination for a Read operation.

FIG. 5C is a flow diagram of an embodiment of a process for selectively applying on-die termination for a Read operation. A memory subsystem can include multiple memory devices or DRAMs that store data, and a memory controller that provides memory access commands to the memory devices. The memory devices are organized as ranks of memory, with multiple devices that respond together to a memory access command forming a rank. In one embodiment, the ranks are separated in multiple different multi-device packages. The operations of process 550 occur in the memory subsystem.

In one embodiment, the memory controller receives a request from a host system processor that includes the need to read from memory, 552. In one embodiment, the memory controller identifies one of the number of memory ranks in the system as a target rank for the read command, 554. The memory controller will identify the target memory rank based on how data is mapped to the memory arrays of the memory devices. In one embodiment, the memory controller determines what ranks should engage ODT and/or change an ODT setting based on the rank identified as the target rank, 556. In one embodiment, the memory controller further determines what value of ODT should be applied by each rank that will apply ODT.

In one embodiment, the memory controller triggers one or more non-driving or non-target ranks to engage and/or change ODT, based on the determination made, 558. Thus, the memory controller can select one or more ranks to engage termination to reduce reflections while the target rank sends data to the memory controller. As described above, the memory controller can selectively trigger specific memory devices to engage ODT or change an ODT setting by use of an enable or chip select signal. In one embodiment, the memory controller could issue a separate command to cause the memory device to engage ODT. The target rank will execute the read command while any selected to engage ODT has ODT engaged, 560.

Figure 5D:
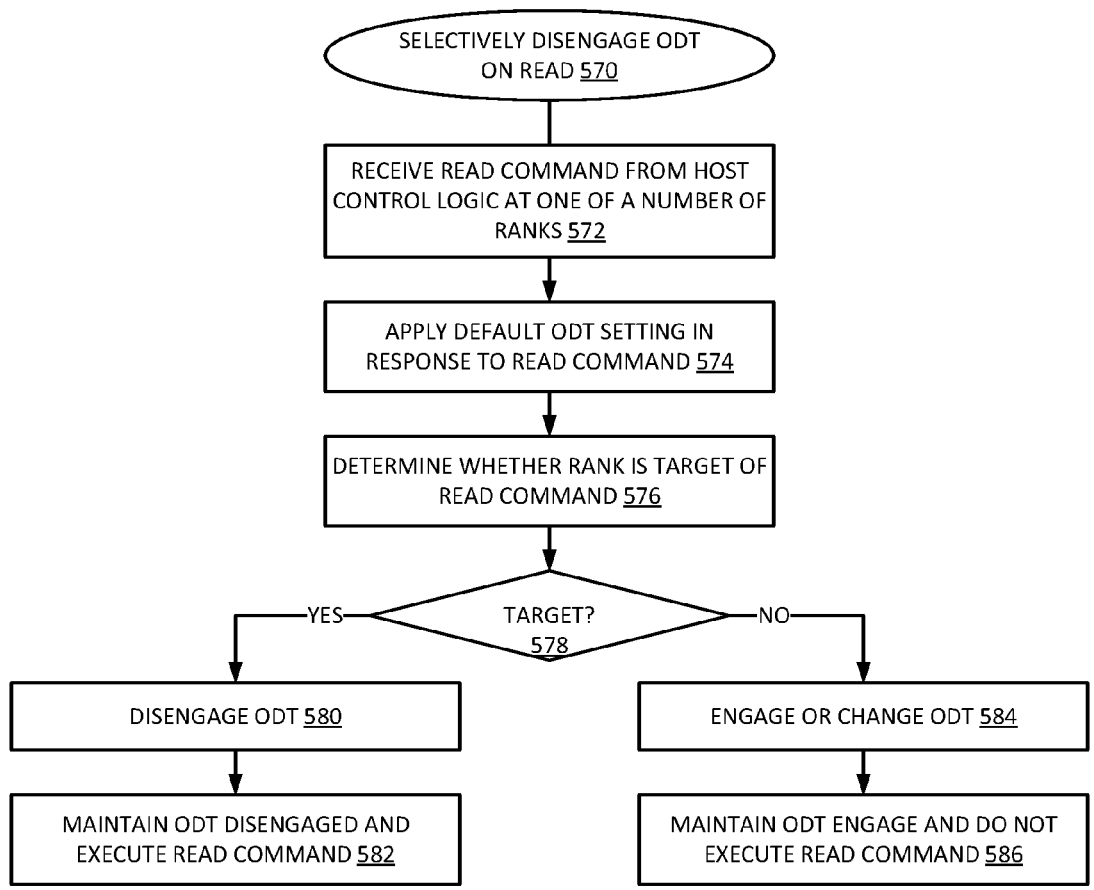
FIG. 5D is a flow diagram of an embodiment of a process for selectively engaging on-die termination for a Read operation.

FIG. 5D is a flow diagram of an embodiment of a process for selectively engaging on-die termination for a Read operation. A memory subsystem can include multiple memory devices or DRAMs that store data, and a memory controller that provides memory access commands to the memory devices. The memory devices are organized as ranks of memory, with multiple devices that respond together to a memory access command forming a rank. In one embodiment, the ranks are separated in multiple different multi-device packages. The operations of process 570 occur in the memory subsystem.

In one embodiment, a memory device that is one of multiple memory devices in one of multiple ranks in the memory subsystem receives a read command from the memory controller, 572. As discussed above, in one embodiment, a memory device receives a memory access command when the memory controller selects the device to receive the command. In one embodiment, the memory device decodes the incoming memory access command and determines that it is a read command, and that it is selected to receive the command. In response to the receiving the read command and decoding the command, the memory device can apply a default ODT setting, 574. In one embodiment, the default setting is to disable ODT for the Read transaction. In one embodiment, the memory device has ODT disengaged when receiving a Read command, and engages ODT if it is not registered or selected in a CAS-2 command received directly subsequent to the Read command.

In one embodiment, the memory device determines whether it is part of the target rank for the read command, 576. In one embodiment, the memory device makes the determination based on whether it is selected in a subsequent memory access command (e.g., in a CAS-2 command as described above). In one embodiment, the memory device can receive another command from the memory controller indicating the target rank. If the memory device is part of the target rank, 578 YES branch, the memory device disables ODT, 580, and maintains ODT disengaged and executes the read command, 582. If the memory device is not part of the target rank, 578 NO branch, the memory device determines whether to engage ODT or change an ODT setting, 584. In one embodiment, other ranks in the memory subsystem will not be selected and thus not receive the Read command. Such ranks will maintain a default ODT setting, such as disabled. In one embodiment, a rank that is selected to receive the Read command, but is not the target rank will engage ODT or increase an ODT value if the default value is some value of resistance, 584. The non-target rank maintains the ODT engaged for the Read transaction but does not execute the read command, 586.

Figure 6:
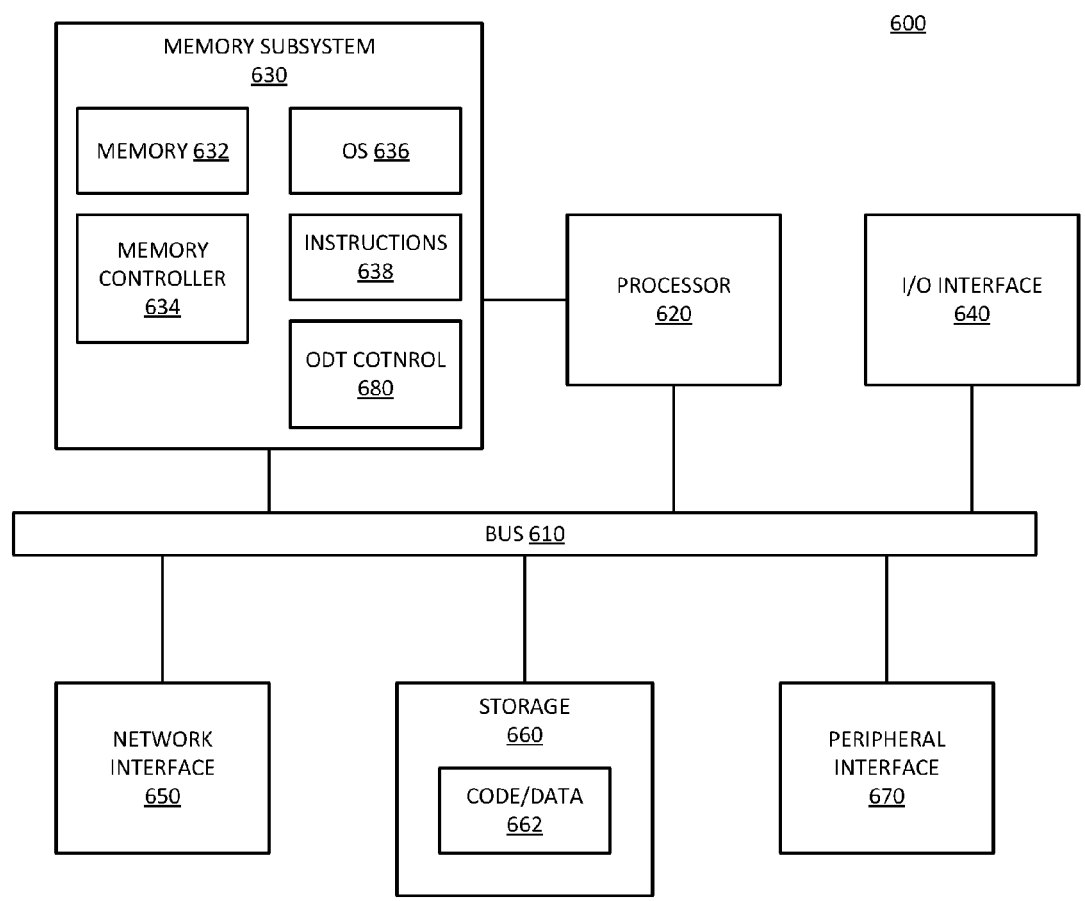
FIG. 6 is a block diagram of an embodiment of a computing system in which on-die termination control can be implemented.

FIG. 6 is a block diagram of an embodiment of a computing system in which on-die termination control can be implemented. System 600 represents a computing device in accordance with any embodiment described herein, and can be a laptop computer, a desktop computer, a server, a gaming or entertainment control system, a scanner, copier, printer, routing or switching device, or other electronic device. System 600 includes processor 620, which provides processing, operation management, and execution of instructions for system 600. Processor 620 can include any type of microprocessor, central processing unit (CPU), processing core, or other processing hardware to provide processing for system 600. Processor 620 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 can include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620. Memory subsystem 630 includes memory device 632 where it stores data, instructions, programs, or other items. In one embodiment, memory subsystem includes memory controller 634, which is a memory controller to generate and issue commands to memory device 632. It will be understood that memory controller 634 could be a physical part of processor 620.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 can also correspond to interfaces in network interface 650.

System 600 also includes one or more input/output (I/O) interface(s) 640, network interface 650, one or more internal mass storage device(s) 660, and peripheral interface 670 coupled to bus 610. I/O interface 640 can include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 can include an Ethernet adapter, wireless interconnection components, USB (universal serial bus), or other wired or wireless standards-based or proprietary interfaces.

Storage 660 can be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 can be generically considered to be a "memory," although memory 630 is the executing or operating memory to provide instructions to processor 620. Whereas storage 660 is nonvolatile, memory 630 can include volatile memory (i.e., the value or state of the data is indeterminate if power is interrupted to system 600).

Peripheral interface 670 can include any hardware interface not specifically mentioned above. Peripherals refer generally to devices that connect dependently to system 600. A dependent connection is one where system 600 provides the software and/or hardware platform on which operation executes, and with which a user interacts.

In one embodiment, memory subsystem 630 is a multi-rank memory. In one embodiment, system 600 includes ODT control 680, which enables the system to selectively control the activation of ODT at the different ranks. Thus, the system can selectively cause target and non-target ranks to change an ODT setting for a memory access operation. More specifically, in one embodiment, memory controller 634 can selectively trigger memory devices to activate ODT to preserve signal quality on Write, even in systems where the multiple ranks are separated in multiple packages. On Write the system can cause multiple ranks to engage ODT. In one embodiment, memory controller 634 can selectively trigger memory devices to engage ODT on Read. On Read the system can select one or more non-target ranks to apply ODT. In one embodiment, ODT control can also selectively determine what value of resistor to apply for ODT.

Figure 7:
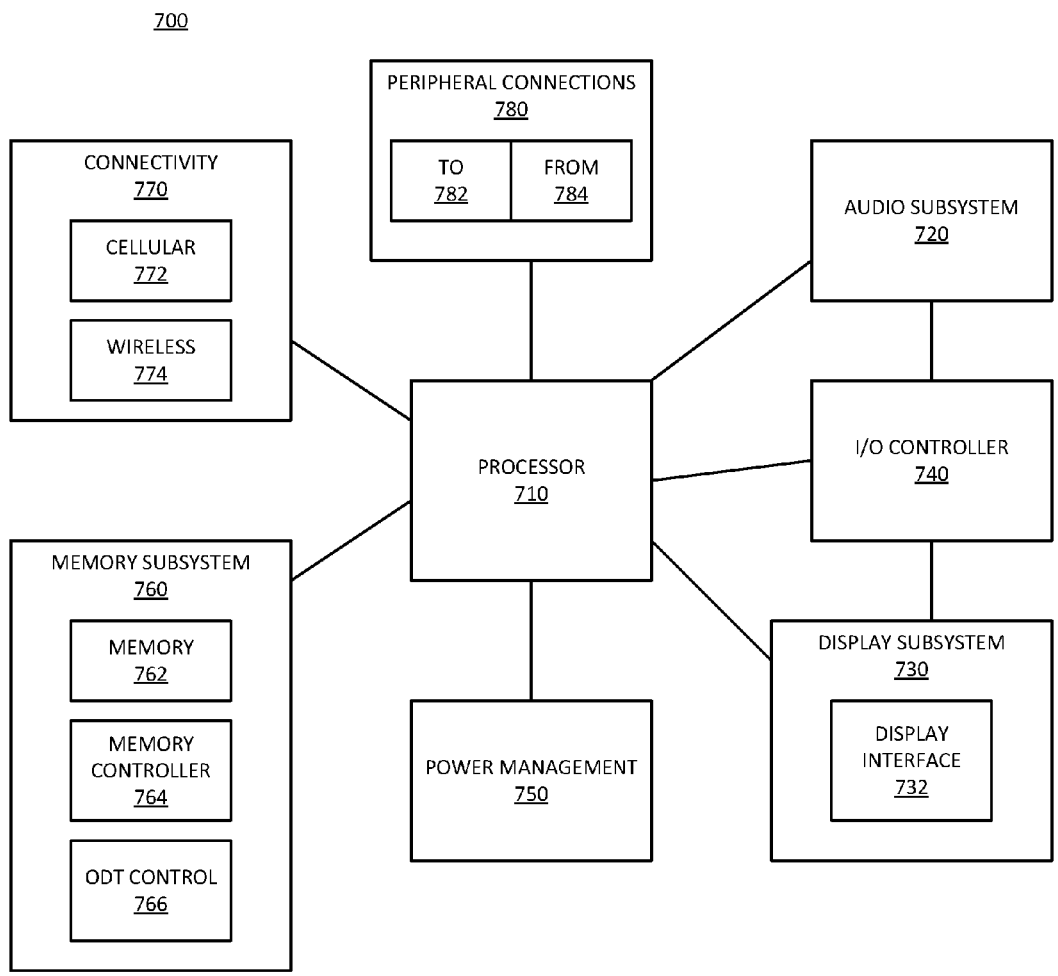
FIG. 7 is a block diagram of an embodiment of a mobile device in which on-die termination control can be implemented.

FIG. 7 is a block diagram of an embodiment of a mobile device in which on-die termination control can be implemented. Device 700 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user. In one embodiment, display subsystem 730 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features). In one embodiment, device 700 includes power management 750 that manages battery power usage, charging of the battery, and features related to power saving operation.

Memory subsystem 760 includes memory device(s) 762 for storing information in device 700. Memory subsystem 760 can include nonvolatile (state does not change if power to the memory device is interrupted) and/or volatile (state is indeterminate if power to the memory device is interrupted) memory devices. Memory 760 can store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710). Memory controller 764 includes a scheduler to generate and issue commands to memory device 762.

Connectivity 770 includes hardware devices (e.g., wireless and/or wired connectors and communication hardware) and software components (e.g., drivers, protocol stacks) to enable device 700 to communicate with external devices. The external device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 760 is a multi-rank memory. In one embodiment, system 700 includes ODT control 766, which enables the system to selectively control the activation of ODT at the different ranks. Thus, the system can selectively cause target and non-target ranks to change an ODT setting for a memory access operation.

More specifically, in one embodiment, memory controller 764 can selectively trigger memory devices to activate ODT to preserve signal quality on Write, even in systems where the multiple ranks are separated in multiple packages. On Write the system can cause multiple ranks to engage ODT. In one embodiment, memory controller 764 can selectively trigger memory devices to engage ODT on Read. On Read the system can select one or more non-target ranks to apply ODT. In one embodiment, ODT control can also selectively determine what value of resistor to apply for ODT.

In one aspect, a method for selectively applying on-die termination includes: sending a memory access command concurrently to a number of ranks of memory devices corresponding to a memory access operation, the memory access command directed to a target rank to execute the command; triggering one or more non-target ranks of the number of ranks to change an on-die termination (ODT) setting for a duration of the memory access operation; and selecting the target rank to execute the memory access operation.

In one embodiment, the memory access command comprises sending a read command, and wherein triggering the one or more non-target ranks to change the ODT setting comprises triggering the a non-target rank to engage ODT. In one embodiment, sending the memory access command comprises sending a write command, and wherein triggering the one or more non-target ranks to change the ODT setting comprises triggering the target rank and at least one non-target rank to engage ODT. In one embodiment, sending the memory access command comprises sending the memory access command from a memory controller. In one embodiment, sending the memory access command comprises sending multiple sequential commands to generate the memory access operation. In one embodiment, the triggering further comprises sending a first command indicating the memory access operation and a second command with a column address selection for the memory access operation, where the sequence of the first and second commands indicates an ODT setting to the ranks. In one embodiment, the memory access command comprises a read command, and further wherein sending the second command without selecting the one or more non-target ranks triggers the one or more non-target ranks to engage ODT for the read operation. In one embodiment, the memory access command comprises a write command, and further wherein sending the first command triggers the one or more non-target ranks to engage ODT for the write operation. In one embodiment, triggering the multiple ranks to change the ODT setting comprises triggering the one or more non-target ranks to change the ODT setting to one of multiple values of on-die termination resistance. In one embodiment, selecting the target rank comprises selecting the target rank with an enable signal, and not selecting the non-target ranks with the enable signal. In one embodiment, selecting the target rank with the enable signal comprises selecting the target rank with a chip select signal.

In one aspect, a memory controller device to selectively apply on-die termination includes: hardware connectors to couple to a multi-device package having multiple memory devices organized as a plurality of ranks; and logic to send a memory access command concurrently to multiple of the ranks of memory devices corresponding to a memory access operation, the memory access command directed to a target rank to execute the command; trigger one or more non-target ranks to change an on-die termination (ODT) setting for a duration of the memory access operation; and select the target rank to execute the memory access command with ODT at the changed ODT setting.

In one embodiment, the memory controller device is part of a host processor subsystem. In one embodiment, the logic is to send a read command and trigger one or more non-target ranks to engage ODT. In one embodiment, the logic is to send a write command and trigger the target rank and one or more non-target ranks to engage ODT. In one embodiment, the logic is to send multiple sequential commands to generate the memory access operation. In one embodiment, further comprising the logic to send a first command indicating the memory access operation and a second command with a column address selection for the memory access command directly after the first command, wherein the sequence of the first and second commands is to trigger the one or more non-target ranks to engage ODT. In one embodiment, the logic is to select the target rank with the second command and not select the one or more non-target ranks with the second command. In one embodiment, the memory access command comprises a read command, and further wherein the logic is to send the second command without selecting the one or more non-target ranks triggers the one or more non-target ranks to engage ODT for the read operation. In one embodiment, the memory access command comprises a write command, and further wherein the logic is to send the first command triggers the one or more non-target ranks to engage ODT for the write operation. In one embodiment, the logic is to trigger the one or more non-target ranks to change the ODT setting to one of multiple values of on-die termination resistance. In one embodiment, the logic is to select the target rank with an enable signal, and not select the non-target ranks with the enable signal. In one embodiment, the logic is to select the target rank with a chip select signal, and not select the one or more non-target ranks with the chip select signal.

In one aspect, an electronic device with a memory controller to selectively apply on-die termination includes: a multi-device package having multiple memory devices organized as a plurality of ranks; and a memory controller including hardware connectors to couple to the multi-device package, and logic to send a memory access command concurrently to multiple of the ranks of memory devices corresponding to a memory access operation, the memory access command directed to a target rank to execute the command; trigger one or more non-target ranks to change an on-die termination (ODT) setting for a duration of the memory access operation; and select the target rank to execute the memory access command with ODT at the changed ODT setting; and a touchscreen display coupled to generate a display based on data accessed from the memory devices.

In one embodiment, the memory controller device is part of a host processor subsystem. In one embodiment, the logic is to send a read command and trigger one or more non-target ranks to engage ODT. In one embodiment, the logic is to send a write command and trigger the target rank and one or more non-target ranks to engage ODT. In one embodiment, the logic is to send multiple sequential commands to generate the memory access operation. In one embodiment, further comprising the logic to send a first command indicating the memory access operation and a second command with a column address selection for the memory access command directly after the first command, wherein the sequence of the first and second commands is to trigger the one or more non-target ranks to engage ODT. In one embodiment, the logic is to select the target rank with the second command and not select the one or more non-target ranks with the second command. In one embodiment, the memory access command comprises a read command, and further wherein the logic is to send the second command without selecting the one or more non-target ranks triggers the one or more non-target ranks to engage ODT for the read operation. In one embodiment, the memory access command comprises a write command, and further wherein the logic is to send the first command triggers the one or more non-target ranks to engage ODT for the write operation. In one embodiment, the logic is to trigger the one or more non-target ranks to change the ODT setting to one of multiple values of on-die termination resistance. In one embodiment, the logic is to select the target rank with an enable signal, and not select the non-target ranks with the enable signal. In one embodiment, the logic is to select the target rank with a chip select signal, and not select the one or more non-target ranks with the chip select signal.

In one aspect, an article of manufacture comprising a computer readable storage medium having content stored thereon, which when executed performs operations for selectively applying on-die termination, including: sending a memory access command concurrently to a number of ranks of memory devices corresponding to a memory access operation, the memory access command directed to a target rank to execute the command; triggering one or more non-target ranks of the number of ranks to change an on-die termination (ODT) setting for a duration of the memory access operation; and selecting the target rank to execute the memory access operation.

In one embodiment, the content for sending the memory access command comprises content for sending a read command, and wherein the content for triggering the one or more non-target ranks to change the ODT setting comprises content for triggering the a non-target rank to engage ODT. In one embodiment, the content for sending the memory access command comprises content for sending a write command, and wherein the content for triggering the one or more non-target ranks to change the ODT setting comprises content for triggering the target rank and at least one non-target rank to engage ODT. In one embodiment, the content for sending the memory access command comprises content for sending the memory access command from a memory controller. In one embodiment, the content for sending the memory access command comprises content for sending multiple sequential commands to generate the memory access operation. In one embodiment, the content for triggering further comprises content for sending a first command indicating the memory access operation and a second command with a column address selection for the memory access operation, where the sequence of the first and second commands indicates an ODT setting to the ranks. In one embodiment, the memory access command comprises a read command, and further wherein the content for sending the second command without selecting the one or more non-target ranks triggers the one or more non-target ranks to engage ODT for the read operation. In one embodiment, the memory access command comprises a write command, and further wherein the content for sending the first command triggers the one or more non-target ranks to engage ODT for the write operation. In one embodiment, the content for triggering the multiple ranks to change the ODT setting comprises content for triggering the one or more non-target ranks to change the ODT setting to one of multiple values of on-die termination resistance. In one embodiment, the content for selecting the target rank comprises content for selecting the target rank with an enable signal, and not selecting the non-target ranks with the enable signal. In one embodiment, the content for selecting the target rank with the enable signal comprises content for selecting the target rank with a chip select signal.

In one aspect, an apparatus for selectively applying on-die termination includes: means for sending a memory access command concurrently to a number of ranks of memory devices corresponding to a memory access operation, the memory access command directed to a target rank to execute the command; means for triggering one or more non-target ranks of the number of ranks to change an on-die termination (ODT) setting for a duration of the memory access operation; and means for selecting the target rank to execute the memory access operation.

In one embodiment, the means for sending the memory access command comprises means for sending a read command, and wherein the means for triggering the one or more non-target ranks to change the ODT setting comprises means for triggering the a non-target rank to engage ODT. In one embodiment, the means for sending the memory access command comprises means for sending a write command, and wherein the means for triggering the one or more non-target ranks to change the ODT setting comprises means for triggering the target rank and at least one non-target rank to engage ODT. In one embodiment, the means for sending the memory access command comprises means for sending the memory access command from a memory controller. In one embodiment, the means for sending the memory access command comprises means for sending multiple sequential commands to generate the memory access operation. In one embodiment, the means for triggering further comprises means for sending a first command indicating the memory access operation and a second command with a column address selection for the memory access operation, where the sequence of the first and second commands indicates an ODT setting to the ranks. In one embodiment, the memory access command comprises a read command, and further wherein the means for sending the second command without selecting the one or more non-target ranks triggers the one or more non-target ranks to engage ODT for the read operation. In one embodiment, the memory access command comprises a write command, and further wherein the means for sending the first command triggers the one or more non-target ranks to engage ODT for the write operation. In one embodiment, the means for triggering the multiple ranks to change the ODT setting comprises means for triggering the one or more non-target ranks to change the ODT setting to one of multiple values of on-die termination resistance. In one embodiment, the means for selecting the target rank comprises means for selecting the target rank with an enable signal, and not selecting the non-target ranks with the enable signal. In one embodiment, the means for selecting the target rank with the enable signal comprises means for selecting the target rank with a chip select signal.

In one aspect, a method for selectively applying on-die termination includes: receiving a memory access command at a memory rank, wherein the memory rank is one of a number of ranks in a memory subsystem; in response to receiving the memory access command, engaging on-die termination (ODT) for the memory rank; and determining whether the memory rank is a target rank for the memory access command, and if the memory rank is the target rank, executing the memory access command; otherwise, keeping ODT engaged without executing the memory access command.

In one embodiment, sending the memory access command comprises sending a read command. In one embodiment, sending the memory access command comprises sending a write command. In one embodiment, receiving the memory access command comprises receiving the memory access command from a system on a chip including a host processor. In one embodiment, receiving the memory access command comprises receiving multiple sequential commands that indicate a memory access operation. In one embodiment, further comprising receiving a first command indicating the memory access operation. In one embodiment, further comprising receiving a second command indicating a column address selection for the memory access operation, wherein determining whether the memory rank is the target rank comprises determining whether the memory rank is selected in the second command. In one embodiment, engaging ODT comprises engaging one of multiple values of on-die termination resistance. In one embodiment, engaging ODT comprises engaging a lower value of on-die termination resistance if the memory rank is the target rank, and engaging a higher value of on-die termination resistance if the memory rank is not the target rank. In one embodiment, determining whether the memory rank is the target rank comprises reading an enable signal of the memory access command. In one embodiment, reading the enable signal comprises reading a chip select signal.

In one aspect, a memory device to selectively apply on-die termination includes: hardware connectors to couple to other memory devices in a multi-device package having multiple memory devices organized as a plurality of ranks; and logic to receive a memory access command; in response to receiving the memory access command, engage on-die termination (ODT) for the memory rank; and determine whether the memory rank is a target rank for the memory access command, and if the memory rank is the target rank, the logic to execute the memory access command; otherwise, to keep ODT engaged without executing the memory access command.

In one embodiment, the logic is to send a read memory access command. In one embodiment, the logic is to send a write memory access command. In one embodiment, the logic is to receive the memory access command from a system on a chip including a host processor. In one embodiment, the logic is to receive multiple sequential commands that indicate a memory access operation. In one embodiment, further comprising the logic to receive a first command indicating the memory access operation. In one embodiment, further comprising the logic to receive a second command indicating a column address selection for the memory access operation, wherein the logic is to determine whether the memory rank is selected in the second command. In one embodiment, the logic is to engage one of multiple values of on-die termination resistance. In one embodiment, the logic is to engage a lower value of on-die termination resistance if the memory rank is the target rank, and engage a higher value of on-die termination resistance if the memory rank is not the target rank. In one embodiment, the logic is to read an enable signal of the memory access command. In one embodiment, the logic is to read a chip select signal.

In one aspect, an electronic device with a memory device to selectively apply on-die termination includes: a memory subsystem to store data, the memory subsystem including a memory controller; and a multi-device package having multiple memory devices organized as a plurality of ranks, including a memory device including hardware connectors to couple to other memory devices in a multi-device package having multiple memory devices organized as a plurality of ranks; and logic to receive a memory access command; in response to receiving the memory access command, engage on-die termination (ODT) for the memory rank; and determine whether the memory rank is a target rank for the memory access command, and if the memory rank is the target rank, the logic to execute the memory access command; otherwise, to keep ODT engaged without executing the memory access command; and a touchscreen display coupled to generate a display based on data accessed from the memory devices.

In one embodiment, the logic is to send a read memory access command. In one embodiment, the logic is to send a write memory access command. In one embodiment, the logic is to receive the memory access command from a system on a chip including a host processor. In one embodiment, the logic is to receive multiple sequential commands that indicate a memory access operation. In one embodiment, further comprising the logic to receive a first command indicating the memory access operation. In one embodiment, further comprising the logic to receive a second command indicating a column address selection for the memory access operation, wherein the logic is to determine whether the memory rank is selected in the second command. In one embodiment, the logic is to engage one of multiple values of on-die termination resistance. In one embodiment, the logic is to engage a lower value of on-die termination resistance if the memory rank is the target rank, and engage a higher value of on-die termination resistance if the memory rank is not the target rank. In one embodiment, the logic is to read an enable signal of the memory access command. In one embodiment, the logic is to read a chip select signal.

In one aspect, an article of manufacture comprising a computer readable storage medium having content stored thereon, which when executed performs operations for selectively applying on-die termination, including: receiving a memory access command at a memory rank, wherein the memory rank is one of a number of ranks in a memory subsystem; in response to receiving the memory access command, engaging on-die termination (ODT) for the memory rank; and determining whether the memory rank is a target rank for the memory access command, and if the memory rank is the target rank, executing the memory access command; otherwise, keeping ODT engaged without executing the memory access command.

In one embodiment, the content for sending the memory access command comprises content for sending a read command. In one embodiment, the content for sending the memory access command comprises content for sending a write command. In one embodiment, the content for receiving the memory access command comprises content for receiving the memory access command from a system on a chip including a host processor. In one embodiment, the content for receiving the memory access command comprises content for receiving multiple sequential commands that indicate a memory access operation. In one embodiment, further comprising content for receiving a first command indicating the memory access operation. In one embodiment, further comprising content for receiving a second command indicating a column address selection for the memory access operation, wherein the content for determining whether the memory rank is the target rank comprises content for determining whether the memory rank is selected in the second command. In one embodiment, wherein the content for engaging ODT comprises content for engaging one of multiple values of on-die termination resistance. In one embodiment, wherein the content for engaging ODT comprises content for engaging a lower value of on-die termination resistance if the memory rank is the target rank, and content for engaging a higher value of on-die termination resistance if the memory rank is not the target rank. In one embodiment, the content for determining whether the memory rank is the target rank comprises content for reading an enable signal of the memory access command. In one embodiment, the content for reading the enable signal comprises content for reading a chip select signal.

In one aspect, an apparatus for selectively applying on-die termination includes: means for receiving a memory access command at a memory rank, wherein the memory rank is one of a number of ranks in a memory subsystem; means for engaging, in response to receiving the memory access command, on-die termination (ODT) for the memory rank; and means for determining whether the memory rank is a target rank for the memory access command, and if the memory rank is the target rank, means for executing the memory access command; otherwise, means for keeping ODT engaged without executing the memory access command.

In one embodiment, the means for sending the memory access command comprises means for sending a read command. In one embodiment, the means for sending the memory access command comprises means for sending a write command. In one embodiment, the means for receiving the memory access command comprises means for receiving the memory access command from a system on a chip including a host processor. In one embodiment, the means for receiving the memory access command comprises means for receiving multiple sequential commands that indicate a memory access operation. In one embodiment, further comprising means for receiving a first command indicating the memory access operation. In one embodiment, further comprising means for receiving a second command indicating a column address selection for the memory access operation, wherein the means for determining whether the memory rank is the target rank comprises means for determining whether the memory rank is selected in the second command. In one embodiment, the means for engaging ODT comprises means for engaging one of multiple values of on-die termination resistance. In one embodiment, the means for engaging ODT comprises means for engaging a lower value of on-die termination resistance if the memory rank is the target rank, and means for engaging a higher value of on-die termination resistance if the memory rank is not the target rank. In one embodiment, the means for determining whether the memory rank is the target rank comprises means for reading an enable signal of the memory access command. In one embodiment, the means for reading the enable signal comprises means for reading a chip select signal.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A dynamic random access memory (DRAM) device comprising:
   input/output interface hardware to receive a memory access command followed by a CAS-2 (column address selection) command;
   on-die termination (ODT) circuitry to selectively apply termination to a data signal line; and
   a register to store an ODT setting to indicate a termination impedance for non-target termination;
   wherein the DRAM device is to apply the termination impedance for non-target termination to the data signal line in response to receipt of a non-target CAS-2 command.

2. The memory device of claim 1, wherein the memory access command comprises a Read command.

3. The memory device of claim 2, wherein the memory access command comprises a Read-1 command.

4. The memory device of claim 1, wherein the memory access command comprises a Write command.

5. The memory device of claim 4, wherein the memory access command comprises a Write-1 command.

6. The memory device of claim 1, wherein the memory access command comprises a two-cycle command and the non-target CAS-2 command comprises a two-cycle command.

7. The memory device of claim 6, wherein a chip select (CS) signal is asserted on a first cycle of the memory access command, and wherein the CS signal is not asserted on a first cycle of the non-target CAS-2 command.

8. The memory device of claim 1, wherein the register comprises a mode register to control the non-target ODT termination impedance.

9. The memory device of claim 8, wherein the input/output interface hardware is to receive a mode register set (MRS) command to set the ODT setting in the register.

10. The memory device of claim 9, wherein the input/output interface hardware is to receive the MRS command after the non-target CAS-2 command to change the ODT setting for a subsequent memory access.

11. The memory device of claim 1, wherein the DRAM device comprises a DRAM device of a multi-rank system, wherein the DRAM device is to receive a non-target CAS-2 command if the DRAM device is part of a non-target rank.

12. The memory device of claim 1, wherein the DRAM device comprises a device compatible with a double data rate version 4 (LPDDR4) standard.

13. The memory device of claim 1, wherein the DRAM is to apply the ODT setting selectively based on the non-target CAS-2 command instead of based on a state of an ODT control pin.

14. A method for termination in a dynamic random access memory (DRAM) device, comprising:
receiving a memory access command followed by a CAS-2 (column address selection) command;
determining from a register an on-die termination (ODT) setting that indicates a termination impedance for non-target termination; and
selectively applying to a data signal line the non-target termination impedance with ODT circuitry in response to receiving a non-target CAS-2 command.

15. The method of claim 14, wherein the memory access command comprises a Read command.

16. The method of claim 14, wherein the memory access command comprises a Write command.

17. The method of claim 14, wherein the memory access command comprises a two-cycle command and the non-target CAS-2 command comprises a two-cycle command, wherein a chip select (CS) signal is asserted on a first cycle of the memory access command, and wherein the CS signal is not asserted on a first cycle of the non-target CAS-2 command.

18. The method of claim 14, wherein the register comprises a mode register to control the non-target ODT termination impedance, and further comprising receiving a mode register set (MRS) command to set the ODT setting in the register.

19. The method of claim 14, wherein the DRAM device comprises a DRAM device of a multi-rank system, wherein the DRAM device is to receive a non-target CAS-2 command if the DRAM device is part of a non-target rank.

20. The method of claim 14, wherein the DRAM device comprises a device compatible with a double data rate version 4 (LPDDR4) standard.

21. An apparatus for input/output termination, comprising:
means for receiving a memory access command followed by a CAS-2 (column address selection command;
means for determining from a register an on-die termination (ODT) setting that indicates a termination impedance for non-target termination; and
means for selectively applying to a data signal line the non-target termination impedance with ODT circuitry in response to receiving a non-target CAS-2 command.

22. The apparatus of claim 21, wherein the memory access command comprises a Read command.

23. The apparatus of claim 21, wherein the memory access command comprises a Write command.

24. The apparatus of claim 21, wherein the memory access command comprises a two-cycle command and the non-target CAS-2 command comprises a two-cycle command, wherein a chip select (CS) signal is asserted on a first cycle of the memory access command, and wherein the CS signal is not asserted on a first cycle of the non-target CAS-2 command.

25. The apparatus of claim 21, wherein the register comprises a mode register to control the non-target ODT termination impedance, and further comprising receiving a mode register set (MRS) command to set the ODT setting in the register.

26. The apparatus of claim 21, wherein the DRAM device comprises a DRAM device of a multi-rank system, wherein the DRAM device is to receive a non-target CAS-2 command if the DRAM device is part of a non-target rank.

27. The apparatus of claim 21, wherein the DRAM device comprises a device compatible with a double data rate version 4 (LPDDR4) standard.

* * * * *